(12) United States Patent
Kochan, Jr. et al.

(10) Patent No.: US 10,291,169 B2
(45) Date of Patent: May 14, 2019

(54) CONTROL SYSTEM AND METHOD FOR HIGH VOLTAGE APPLICATIONS

(71) Applicant: Metropolitan Industries, Inc., Romeoville, IL (US)

(72) Inventors: John Kochan, Jr., Naperville, IL (US); James Andrew Nimmer, Minooka, IL (US); John Brian Dempster, Floyds Knobs, IN (US)

(73) Assignee: METROPOLITAN INDUSTRIES, INC., Romeoville, IL (US)

( * ) Notice: Subject to any disclaimer, the term of this patent is extended or adjusted under 35 U.S.C. 154(b) by 0 days.

(21) Appl. No.: 15/899,124

(22) Filed: Feb. 19, 2018

(65) Prior Publication Data
US 2018/0175778 A1 Jun. 21, 2018

Related U.S. Application Data

(63) Continuation-in-part of application No. 15/260,832, filed on Sep. 9, 2016, now Pat. No. 9,923,506.

(51) Int. Cl.
| | |
|---|---|
| *H02M 1/00* | (2006.01) |
| *H02M 1/08* | (2006.01) |
| *H02M 7/539* | (2006.01) |
| *H02P 27/04* | (2016.01) |
| *H02P 27/10* | (2006.01) |
| *H03K 17/687* | (2006.01) |
| *H02M 7/5387* | (2007.01) |

(52) U.S. Cl.
CPC ............. *H02P 27/10* (2013.01); *H02M 1/08* (2013.01); *H02M 7/539* (2013.01); *H03K 17/687* (2013.01); *H02M 7/53871* (2013.01); *H02M 2001/0006* (2013.01); *H02P 27/04* (2013.01); *H02P 2207/05* (2013.01)

(58) Field of Classification Search
CPC ................................. H02P 27/10; H02M 1/08
USPC ......................................................... 318/461
See application file for complete search history.

(56) References Cited

U.S. PATENT DOCUMENTS

| | | |
|---|---|---|
| 6,781,422 B1 | 8/2004 | Yang |
| 2013/0106374 A1 | 5/2013 | Ball |
| 2015/0008890 A1 | 1/2015 | Sasao et al. |
| 2015/0289560 A1 | 10/2015 | Zitturi et al. |
| 2015/0365003 A1 | 12/2015 | Sadwick |

*Primary Examiner* — Erick D Glass
(74) *Attorney, Agent, or Firm* — George S. Pavlik; Husch Blackwell LLP

(57) ABSTRACT

A high-efficiency control system and method is presented. The system can feature a gate drive circuit, a floating charge pump and pump circuitry, and a bootstrap capacitor circuit having a floating ground. The floating charge pump features a ground electrically coupled to a load. The bootstrap circuit can feature a floating ground, with a floating voltage being carried across the bootstrap circuit and delivered to the gate drive circuit to produce an indefinite on-time for switching a high-side of a power supply to the load.

15 Claims, 6 Drawing Sheets

CONTROL SYSTEM AND METHOD FOR HIGH VOLTAGE APPLICATIONS

CROSS-REFERENCE TO RELATED APPLICATION

This application is a continuation-in-part application and claims the benefit of the filing date of U.S. patent application Ser. No. 15/260,832 filed Sep. 9, 2016 entitled MOTOR CONTROL SYSTEM AND METHOD FOR IMPLEMENTING A DIRECT ON-OFF COMMUNICATION ROUTINE (now allowed) ("the '832 Application"). Applicant hereby fully incorporates by reference the '832 Application in its entirety as if set forth fully herein.

FIELD

Embodiments presented herein pertain generally to a control system and method for an electric motor and more specifically to a motor control system and method implementing a direct on-off communication control routine.

BACKGROUND

Synchronous electric motors such as brushless DC motors and permanent-magnetic synchronous motors ("PMSM") or ("PMM") are commonly used for high precision applications where careful speed and/or position control are required. Pulse width modulation (PWM) is a common approach used to control the power supplied to synchronous motors for purposes of controlling the speed and torque of the motor.

Generally, the average value of voltage (and current) fed to the inertial load of a synchronous motor can be controlled through PWM by turning the switch between the power supply and load on and off at a fast rate. Typically, PWM switching frequency has to be much higher than what would affect the load. High frequency PWM power control systems can be easily realizable with semiconductor switches because almost no power is dissipated by the switch in either the "on" or "off" state. However, during the transitions between "on" and "off" states, both voltage and current are nonzero and thus power is dissipated in the switches. By quickly changing the state between fully on and fully off (typically less than 100 nanoseconds), the power dissipation in the switches can be quite low compared to the power being delivered to the load. However, when this low power dissipation of a single switching instance is multiplied by the PWM frequency, the power dissipation can become problematic.

Modern semiconductor switches or transistors such as a MOSFET or insulated-gate bipolar transistors (IGBTs) are well suited components for high-efficiency controllers. Generally, in such applications high-side switch drivers use something called a "bootstrap" technique to produce a floating voltage to switch the gate of a semiconductor switch such as a MOSFET. This common technique can be cost effective, however, it's very limited to on-time because the bootstrap capacitor discharges rapidly. Therefore, a PWM signal must be used to turn the MOSFET on and off thousands of times a second to recharge the bootstrap capacitor. The downfall to this is that MOSFETs dissipate the most energy as heat in the on-off or off-on transition.

This wasted energy is commonly referred to as switching loss. In general, if heat dissipation isn't properly maintained, the switching losses can cascade to the point of complete device failure. Although heat sinks can be commonly used to remedy this problem, PWM control can still be susceptible to higher switching losses which results in lower controller efficiency.

Another common circuit used to produce a voltage higher than the bus voltage to drive the gate of a high-side switch is a charge pump. The basic charge pump is a circuit that switches back and forth between two capacitors, charging one while using the other, to maintain a certain voltage. Due to component limitations with regard to low power capability and limited output-voltage options, as well as cost concerns, the charge pump is commonly only useful in low voltage applications.

Accordingly, there is a need in the art for a high efficiency motor control system that can be reliable and efficient across a wide range of motor loads and speeds. There is additionally a need for such a control system to be cost effective, flexible and robust by being able to minimize heat dissipation and switching loss which can commonly contribute to device failure.

DETAILED DESCRIPTION

Figure 1:
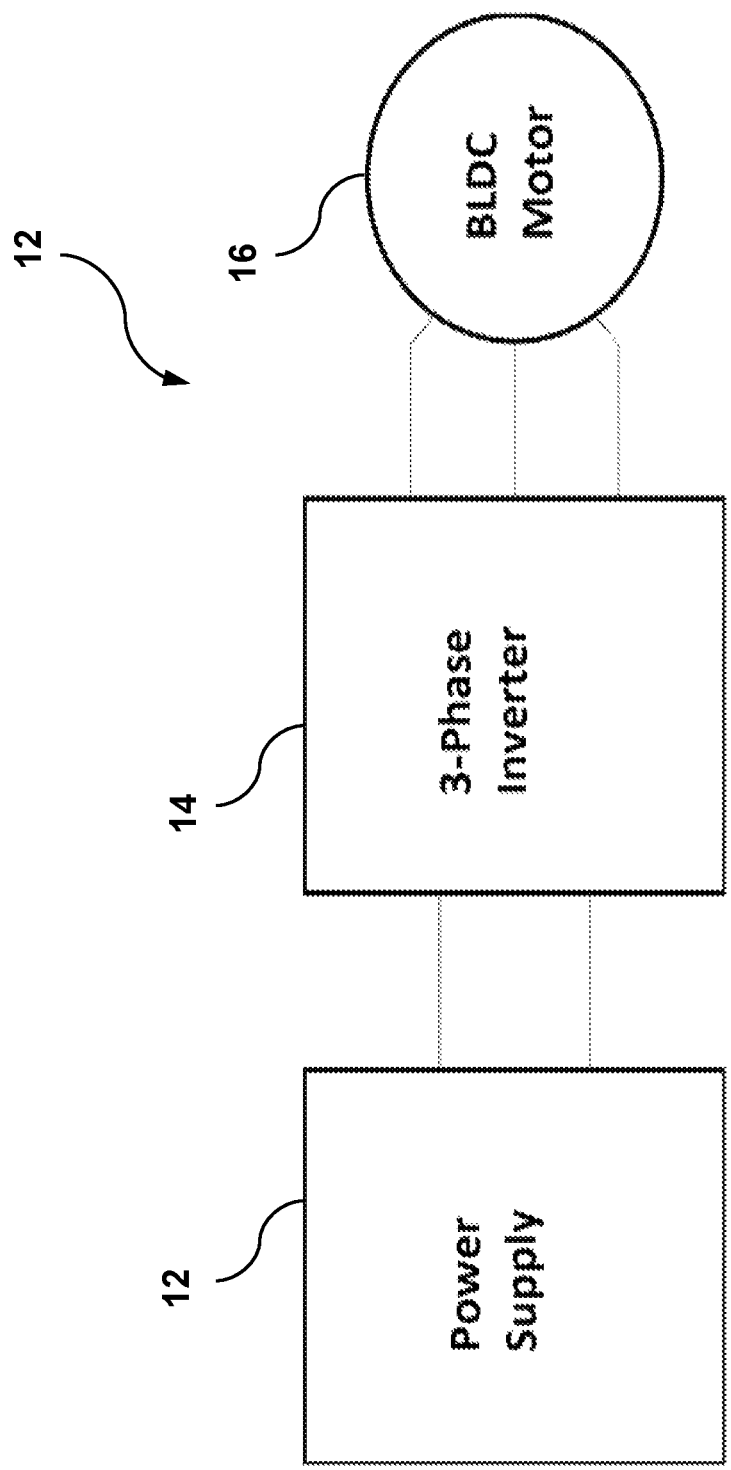
FIG. 1 is a block diagram illustrating components of an exemplary motor control system according to embodiments presented herein.

While the subject invention is susceptible of embodiment in many different forms, there are shown in the drawings and will be described herein in detail specific embodiments thereof with the understanding that the present disclosure is to be considered as an exemplification of the principles of the invention and is not intended to limit the invention to the specific embodiments illustrated.

As presented herein, embodiments of the subject invention are directed to a high-efficiency motor control system for pairing with high-efficiency DC motors and permanent-magnetic synchronous motors ("PMSM") or ("PMM"). Although pulse width modulation (PWM) is a generally well-known system for controlling an electric motor, such systems have several weaknesses, including for example, high switching loss and lower controller efficiency. Embodiments described herein represent an improvement in motor control design and operation. As described herein, such embodiments can utilize a direct on-off commutation routine to control the speed and torque of the motor. As a result, embodiments disclosed herein are able to produce a higher overall system efficiency at a wide range of loads and speeds. The result is a more cost-effective, flexible, and robust motor control system and method.

Referring now to the drawings and to FIG. 1 in particular, there is shown the basic components of a motor control system 10 according to embodiments presented herein. As illustrated in FIG. 1, the system 10 can feature three main stages including: a power supply 12, a three-phase inverter 14 and an electromechanical device 16 driven by the system 10. According to embodiments disclosed herein, the electromechanical device 16 can be electrically coupled to the inverter 14 and can comprise a synchronous electric motor such as, for example, a DC motor or permanent-magnetic synchronous motor ("PMSM") or ("PMM"). The power supply 12 can be electrically coupled, and provide a variable voltage, to the inverter 14. The power supply 12 can be, for example, a high voltage AC to DC buck/boost converter and can consist of multiple stages, including: an electromagnetic interference (EMI) filter, an AC to DC rectification circuit with an active power factor correction (PFC) controller, a buck/boost controller to vary the voltage, and an output bulk capacitor bank and filter. It will be recognized by persons of ordinary skill in the art that such power supply topology can be important to the control method disclosed herein because it can provide precise, efficient and durable control of the speed and torque of the motor 16.

Figure 2:
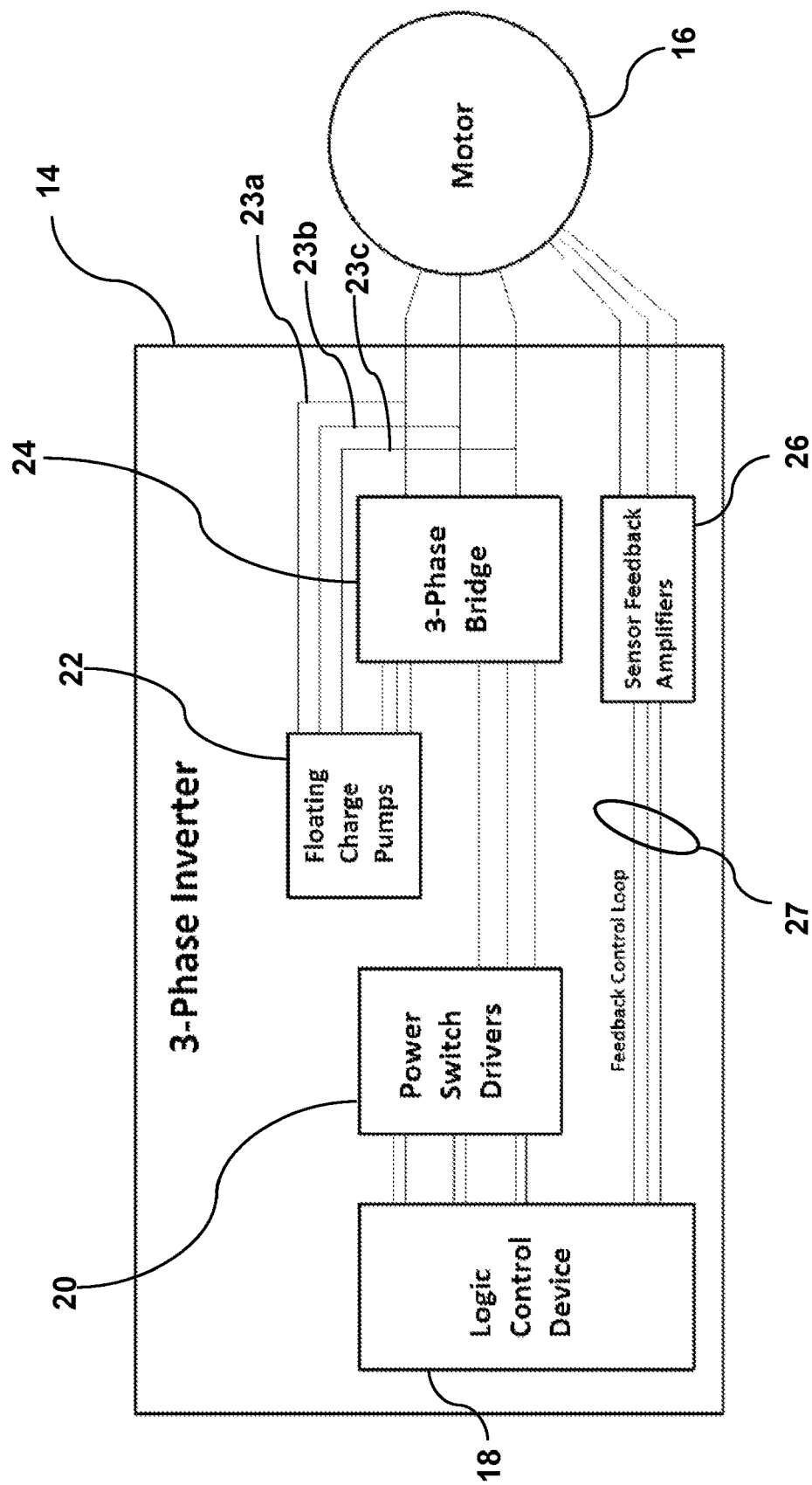
FIG. 2 is a block diagram illustrating components of an exemplary inverter design according to embodiments presented herein.

FIG. 2 illustrates components of an exemplary deign for a three-phase inverter 14 according to embodiments of the subject invention. The inverter 14 can generally comprise five stages including: a logic control device 18 (e.g., a microprocessor or microcontroller) and associated control circuity, power switching device drivers 20, multiple floating charge pumps 22, a 3-phase bridge 24 consisting of six power switching devices or transistors (e.g., metal-oxide-semiconductor field-effect transistors ("MOSFETs")) and sensor feedback amplifiers 26 for receiving electrical feedback from the motor or load. As illustrated in FIG. 2, the logic control device 18 can be electrically coupled to the bridge 24 through the power switch drivers 20 and can be separately coupled to the feedback amplifiers 26 by a feedback control loop 27. The inverter 14 can be electrically coupled to motor 16 through the feedback amplifiers 26 and bridge 24.

Preferably, the inverter 14 can feature three floating charge pumps 22. The floating charge pumps 22 function as independent power supplies with their grounds 23a-23c referenced to the motor phase leads. It will be recognized by persons of ordinary skill in the art that such design is important from the standpoint of using MOSFETs for switching. In particular, when using an N-channel MOSFET to switch the positive rail or high-side of a power supply to a load, the inverter 14 needs a control voltage (also called gate to source voltage) on the order of 10-15 volts above the bus voltage.

Figure 3:
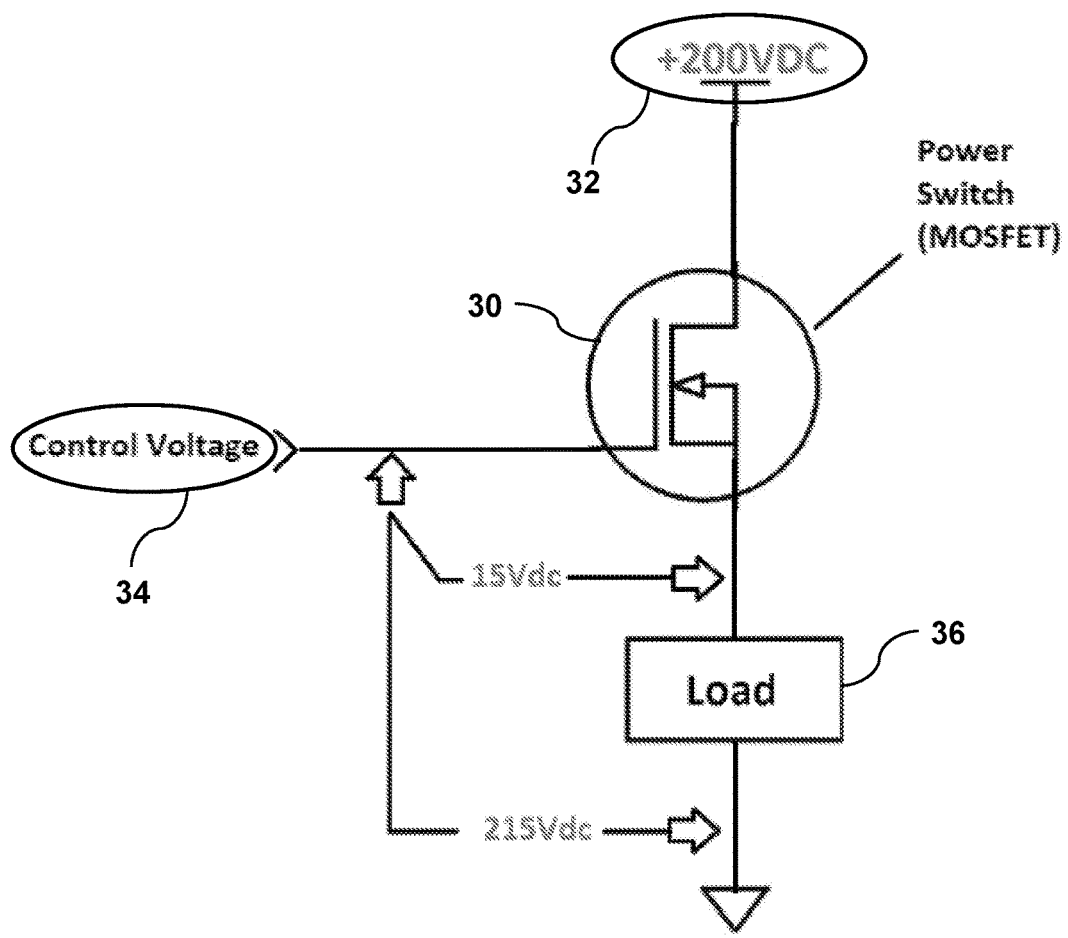
FIG. 3 is a circuit diagram illustrating a MOSFET semiconductor switch and exemplary circuitry for switching the high-side of a power supply to a load according to embodiments presented herein.

FIG. 3 illustrates an exemplary circuit diagram of a MOSFET semiconductor switch 30 according to embodiments presented herein. For example, where the bus voltage 32 is 200 volts referenced to ground, the control voltage 34 can be on the order of 215 volts referenced to ground, with 15 volts referenced to the load 36. As described above, known techniques for switching the gate of a high-side switch include the utilizing "bootstrap" technique or a charge pump. Such techniques, however, each individually have weaknesses including, for example, the anticipated onset of heat dissipation and voltage and cost limitations.

Figure 4:
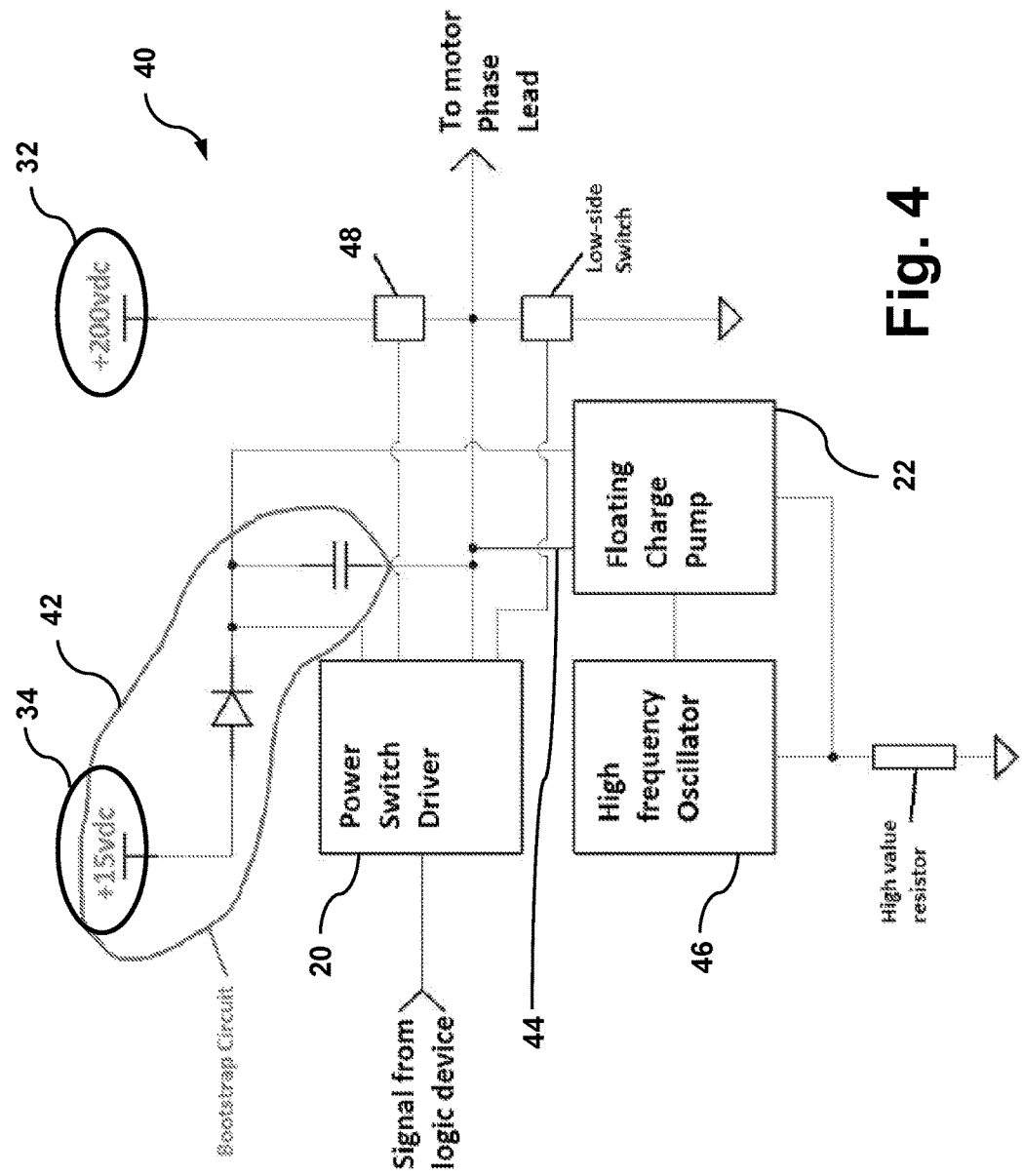
FIG. 4 is a circuit diagram illustrating exemplary high-side driver circuitry comprising a bootstrap circuit in combination with a charge pump circuit according to embodiments set forth herein.

FIG. 4 illustrates an improved design for a high-side driver circuit 40 according to embodiments of the subject invention where a bootstrap capacitor circuit 42 can be hybridized with a charge pump circuit 44. According to such embodiments, by taking advantage of the bootstrap's 42 floating ground and a constant voltage of the charge pump 22, the high-side driver circuit 40 can maintain an indefinite on-time.

As illustrated in FIG. 4, the circuit 40 can also feature a high frequency oscillator 46 that has a high impedance to ground and can control the charge pump 22 to maintain a constant voltage across the bootstrap capacitor 42. Thus, a variable DC bus voltage 32 can be supplied and delivered to a high-side switch 48 of the inverter 14 and a control voltage 34 above the DC bus voltage 32 can be produced and delivered across the bootstrap capacitor 42 to the high-side switch 48 and can switch the high-side of the power supply to a load to maintain an indefinite on-time.

As described above, embodiments set forth herein utilize a direct on-off control technique as opposed to PWM signals to power switches to commutate the current supplied to the motor. Such direct on-off approach can run concurrently while the power supply controls the voltage to vary the speed and torque of the motor.

Figure 5:
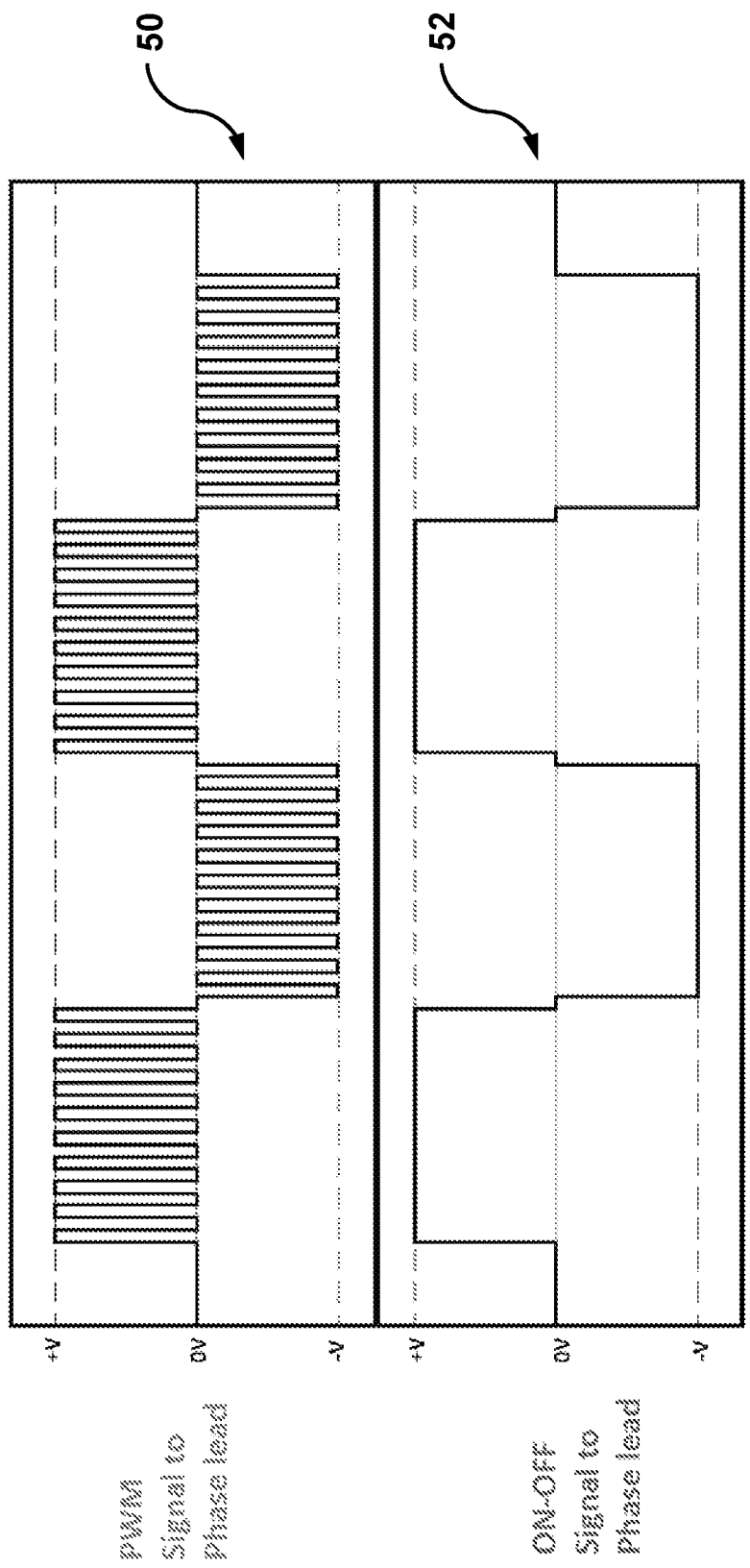
FIG. 5 is a graphical view illustrating a comparison of voltage waveforms between a PWM signal and a continuous on-off communication signal routine according to embodiments of the subject invention.

FIG. 5 is a graphical view illustrating a comparison of voltage waveforms between a PWM signal 50 and a continuous on-off communication signal routine 52 according to embodiments of the subject invention. As illustrated, the PWM signal 50 switches on and off several times per commutation cycle. As it can be expected, PWM control suffers from higher switching losses which results in lower controller efficiency. PWM motor drives can achieve high efficiencies, but not as efficient as the direct on-off approach. With the combination of a variable voltage power supply, an inverter that is capable of indefinite high-side switch on-time, and a high efficiency DC motor or permanent-magnetic synchronous motor ("PMSM") or ("PMM"), improved system efficiencies can be achieved.

Figure 6:
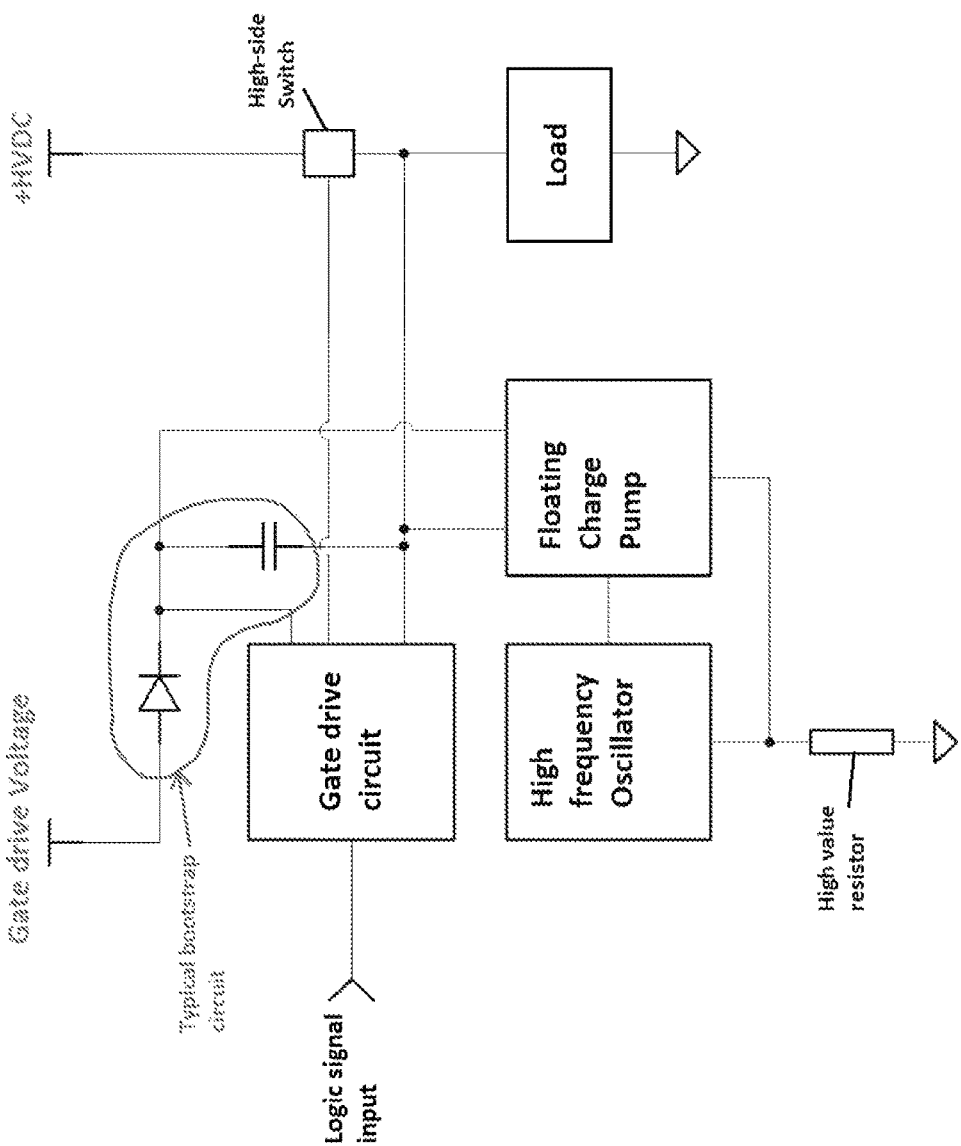
FIG. 6 is a circuit diagram illustrating generic high-side gate driver circuitry for high voltage application comprising a bootstrap circuit in combination with a charge pump circuit according to embodiments set forth herein.

FIG. 6 is a circuit diagram illustrating generic high-side gate driver circuitry 54 for high voltage application. The generic high-side gate driver circuitry 54 includes the floating charge pump 22, the bootstrap circuit 42, the high frequency oscillator 46, the high side switch 48, and a gate drive circuit 56. The generic high-side gate driver circuitry 54 may drive a load 58 and may receive a logic input signal 60, a gate drive voltage 62, and a high voltage DC rail 64.

As illustrated in FIG. 6, the floating charge pump 22, the bootstrap circuit 42, the high frequency oscillator 46 are referenced to ground with a high impedance resistor and low impendence to the load 58. The ground of the floating charge pump 22 and the bootstrap circuit 42 are coupled to the gate drive circuit and also referenced to the load 58. In operation, when the logic input signal 60 is in an inactive state, the gate drive circuit 56 may be off, the load 58 may be disconnected from the high-side of the high voltage dc rail 64 by the high side switch 48, and the bootstrap capacitor of the bootstrap circuit 42 may be charged through the bootstrap diode until the bootstrap capacitor reaches the level of the gate drive voltage 62. The gate drive circuit 56 may remain off while the logic input signal is in its inactive state. When the logic input signal 60 changes to an active state, the voltage across the bootstrap capacitor may be applied to a gate of the gate drive circuit 56 and the gate drive circuit 56 may turn on. The activated driver circuit 56 may connect the load 58 to the high-side of the high voltage dc rail (+HVDC) by activating the high side switch 48. When the bootstrap capacitor voltage falls below a predetermined threshold, the high frequency oscillator 46 may become active which may drive the floating charge pump 22. The floating charge pump 32 may alternate between two capacitors, charging one while discharging the other into the bootstrap capacitor. Voltage limiting may be implemented in the floating charge pump 32 and the high frequency oscillator 46 to a predetermined level so the maximum gate drive voltage is never exceeded. While the logic input signal is in its active state, generic high-side gate driver circuitry 54 may indefinitely maintain a predetermined voltage across the bootstrap capacitor above the minimum gate drive voltage which holds the power switching device on. In some embodiments, the gate drive circuit 56 may include the power switching device driver 20 and a low side switch.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims.

What is claimed is:

1. A control system comprising:
   a gate drive circuit for receiving a logic input signal;
   a floating charge pump and associated pump circuitry, wherein the floating charge pump includes a ground electrically coupled to a load;
   a high-side switching device coupled to the gate drive circuit and the floating charge pump and associated pump circuitry; and
   a bootstrap circuit having a floating ground electrically coupled to the ground of the floating charge pump and associated pump circuitry, wherein the bootstrap circuit is electrically coupled to the gate drive circuit, and wherein a floating gate drive voltage is carried across the bootstrap circuit and delivered to the high-side switching device through the gate drive circuit to switch a high-side of a power supply to the load.

2. The control system of claim 1 wherein the load includes an electomechanical device.

3. The control system of claim 2 wherein the electromechanical device includes at least one of a DC motor and a permanent-magnetic synchronous motor ("PMSM") or ("PMM").

4. The control system of claim 1 wherein the gate drive circuit includes power switching drivers that are solid-state semiconductor switches (MOSFETs).

5. The control system of claim 1 further comprising a high frequency oscillator electrically coupled to the floating charge pump and associated pump circuitry.

6. The control system of claim 1 wherein the gate drive circuit is controlled by the logic input signal.

7. The control system of claim 1 wherein the logic input is received from a logic control device.

8. The control system of claim 7 wherein the logic control device is a microprocessor.

9. A control method utilizing a direct on-off communication routine comprising:
   supplying a DC bus voltage from a power supply to a high-side switch;
   producing a gate drive voltage, the gate drive voltage being above the DC bus voltage;
   delivering the gate drive voltage across a bootstrap capacitor circuit to the high-side switch through the gate drive circuit, the bootstrap capacitor circuit having a floating ground coupled to a ground of a floating charge pump;
   controlling the floating charge pump to maintain the gate drive voltage at a consistent level, the controlling being carried out by a high frequency oscillator, and
   in response to a logic input received at a gate drive circuit, switching the high-side switch with the gate drive voltage to couple a high side of the power supply to a load to maintain an indefinite on-time.

10. The method of claim 9 further comprising providing feedback from the load to a logic control device.

11. The method of claim 9 wherein the DC bus voltage is any voltage level required by the load referenced to ground and the gate drive voltage is the DC bus voltage plus a voltage in a range between a first minimum switching threshold voltage and a first maximum switching voltage allowed by the gate drive circuit in use referenced to ground and in the range of a second minimum switching threshold voltage and a second maximum switching voltage allowed by the gate drive circuit in use referenced to the load.

12. A control system comprising:
   a gate drive circuit for receiving a logic input signal;
   a floating charge pump and associated pump circuitry;
   a high frequency oscillator electrically coupled to the floating charge pump and associated pump circuitry;
   a high-side switch electrically coupled to the gate drive circuit and the floating charge pump and associated pump circuitry; and
   a bootstrap circuit having a floating ground, the bootstrap circuit electrically coupled to the gate drive circuit and the floating charge pump and associated pump circuitry, wherein a floating gate drive voltage is carried across the bootstrap circuit and delivered to the high-side switch to switch a high-side of a DC power supply to a load.

13. The motor control system of claim 12 wherein the load includes at least one of a DC motor and a permanent-magnetic synchronous motor ("PMSM") or ("PMM").

14. The motor control system of claim 12 wherein the DC power supply delivers a DC bus voltage having a voltage level on the order of any voltage required by the load to the high-side switch.

15. The motor control system of claim 14 wherein the floating gate drive voltage carried across the bootstrap capacitor circuit is equal to the DC bus voltage plus a voltage in a range between a first minimum switching threshold voltage and a first maximum switching voltage allowed by the gate drive circuit in use referenced to ground and in a range of a second minimum switching threshold voltage and a second maximum switching voltage referenced to the load.

* * * * *